US009647022B2

(12) United States Patent
Hung et al.

(10) Patent No.: US 9,647,022 B2
(45) Date of Patent: May 9, 2017

(54) MULTI-LAYER STRUCTURE FOR HIGH ASPECT RATIO ETCH

(71) Applicant: Taiwan Semiconductor Manufacturing Co., Ltd., Hsin-Chu (TW)

(72) Inventors: Tsai-Hao Hung, Hsinchu (TW); Han-Tang Lo, Hsinchu (TW); Shih-Chi Kuo, Yangmei (TW); Tsung-Hsien Lee, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/620,460

(22) Filed: Feb. 12, 2015

(65) Prior Publication Data

US 2016/0240568 A1    Aug. 18, 2016

(51) Int. Cl.
*H01L 21/266* (2006.01)
*H01L 21/761* (2006.01)
(Continued)

(52) U.S. Cl.
CPC ........ *H01L 27/1463* (2013.01); *H01L 21/266* (2013.01); *H01L 27/1461* (2013.01);
(Continued)

(58) Field of Classification Search
CPC .................... H01L 21/426; H01L 2221/1026
See application file for complete search history.

(56) References Cited

U.S. PATENT DOCUMENTS 5,073,512 A * 12/1991 Yoshino ............... H01L 21/74
                                              148/DIG. 26
6,190,983 B1 * 2/2001 Tsai ...................... H01L 21/266
                                              257/E21.346
(Continued)

FOREIGN PATENT DOCUMENTS

JP        2003248293 A  *  9/2003

OTHER PUBLICATIONS

Lee, et al. "Image Artifacts by Charge Pocket in Floating Diffusion Region on CMOS Image Sensors." Photodiodes—World Activities in 2011. ISBN-978-953-307-530-3. Published Jul. 29, 2011.

*Primary Examiner* — Brett Feeney
*Assistant Examiner* — Erik T Peterson
(74) *Attorney, Agent, or Firm* — Eschweiler & Potashnik, LLC

(57) ABSTRACT

The present disclosure relates to a method of forming a masking structure having a trench with a high aspect ratio, and an associated structure. In some embodiments, the method is performed by forming a first material over a substrate. The first material is selectively etched and a second material is formed onto the substrate at a position abutting sidewalls of the first material, resulting in a pillar of sacrificial material surrounded by a masking material. The pillar of sacrificial material is removed, resulting in a masking layer having a trench that extends into the masking material. Using the pillar of sacrificial material during formation of the trench allows the trench to have a high aspect ratio. For example, the sacrificial material allows for a plurality of masking layers to be iteratively formed to have laterally aligned openings that collectively form a trench extending through the masking layers.

19 Claims, 10 Drawing Sheets

(51) Int. Cl.
*H01L 21/265* (2006.01)
*H01L 27/146* (2006.01)

(52) U.S. Cl.
CPC .. *H01L 27/14614* (2013.01); *H01L 27/14643* (2013.01); *H01L 27/14689* (2013.01); *H01L 21/26533* (2013.01); *H01L 21/761* (2013.01); *H01L 2221/1026* (2013.01)

(56) References Cited

U.S. PATENT DOCUMENTS

| | | | | |
|---|---|---|---|---|
| 6,660,619 B1* | 12/2003 | Pangrle | ............. | H01L 21/76808 257/E21.579 |
| 2004/0092070 A1 | 5/2004 | Hsu et al. | | |
| 2005/0176167 A1* | 8/2005 | Lee | ................ | H01L 27/14689 438/60 |
| 2008/0057612 A1* | 3/2008 | Doan | ............... | H01L 21/76237 438/57 |
| 2008/0188081 A1* | 8/2008 | Chi | .................. | H01L 21/31116 438/700 |
| 2010/0184242 A1* | 7/2010 | Lin | ..................... | H01L 21/2652 438/57 |
| 2010/0301407 A1* | 12/2010 | Sung | ................... | H01L 29/7827 257/329 |
| 2011/0031576 A1* | 2/2011 | Iwasa | ................ | H01L 21/26513 257/440 |
| 2011/0065270 A1* | 3/2011 | Shim | ................... | H01L 27/11556 438/589 |
| 2011/0254115 A1 | 10/2011 | Shih et al. | | |
| 2012/0052652 A1* | 3/2012 | Fu | ..................... | H01L 21/76237 438/423 |
| 2012/0077301 A1* | 3/2012 | Ahn | .................. | H01L 27/14689 438/73 |
| 2012/0319242 A1* | 12/2012 | Mao | .................. | H01L 21/26513 257/544 |
| 2013/0034929 A1* | 2/2013 | Su | ....................... | H01L 27/1463 438/73 |
| 2013/0307040 A1 | 11/2013 | Ahn et al. | | |
| 2014/0077126 A1* | 3/2014 | Benson | ............ | H01L 21/31116 252/79.1 |
| 2014/0362641 A1* | 12/2014 | Dong | ................... | G11C 11/5642 365/185.17 |
| 2015/0076580 A1* | 3/2015 | Pachamuthu | ..... | H01L 27/11551 257/314 |
| 2015/0079742 A1* | 3/2015 | Pachamuthu | ..... | H01L 27/11551 438/268 |

* cited by examiner

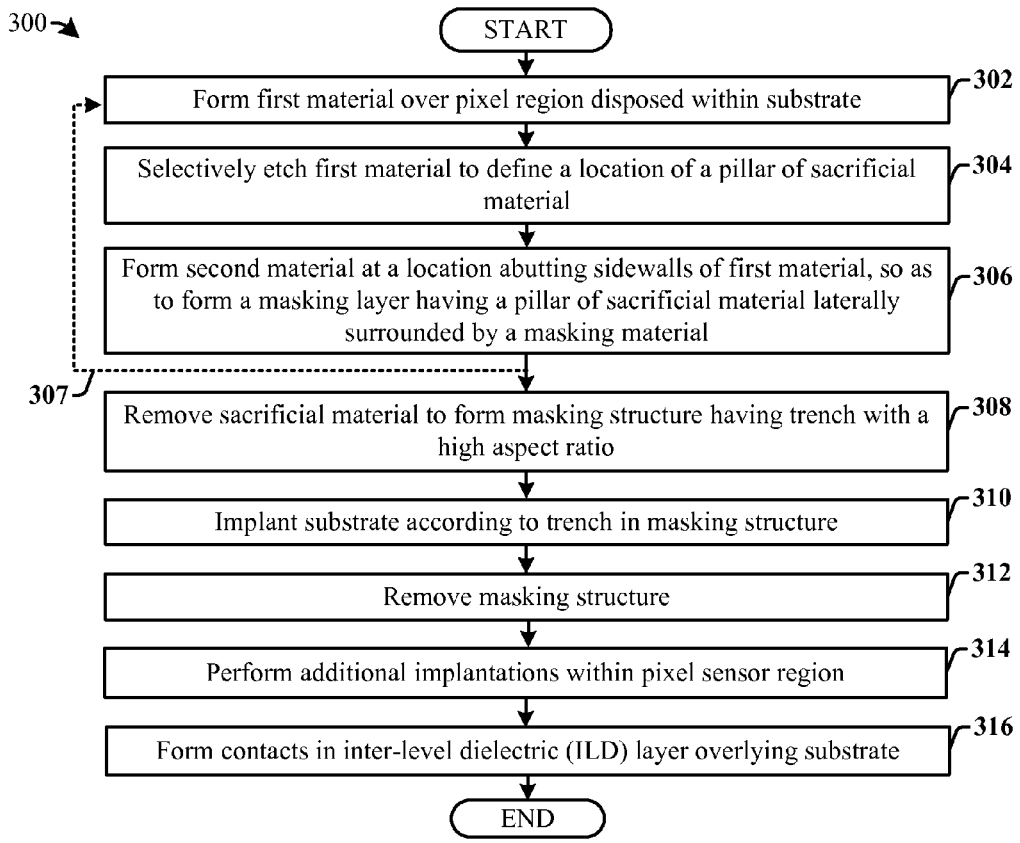
Fig. 3
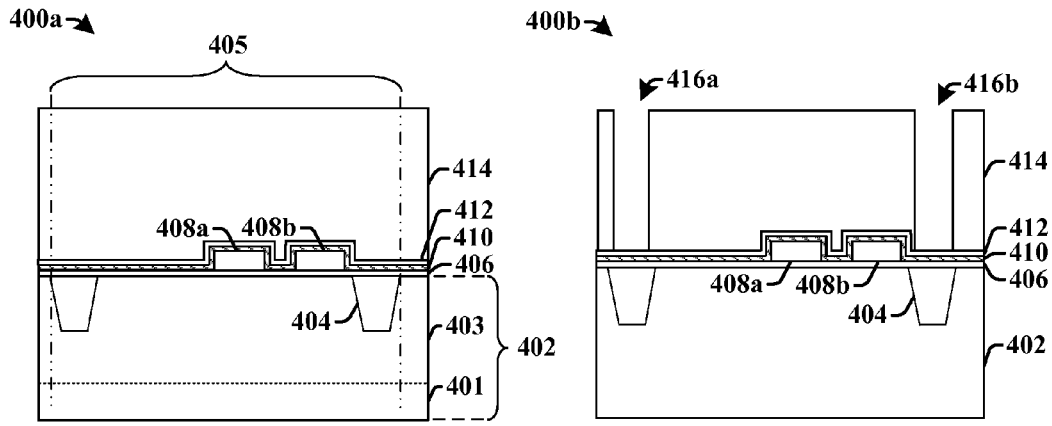
Fig. 4A                    Fig. 4B

Fig. 5A                  Fig. 5B

MULTI-LAYER STRUCTURE FOR HIGH ASPECT RATIO ETCH

BACKGROUND

Digital cameras and optical imaging devices employ image sensors. Image sensors convert optical images to digital data that may be represented as digital images. An image sensor includes an array of pixel sensors, which are unit devices for the conversion of an optical image into digital data. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a flow diagram of some embodiments of a method of forming a CMOS image sensor (CIS) with a masking structure comprising a trench with a high aspect ratio.

FIGS. 4A-4F illustrate some embodiments of cross-sectional views showing a method of forming a CIS with a masking structure comprising a trench with a high aspect ratio.

FIGS. 5A-5C illustrate cross-sectional views of some additional embodiments of masking structures having trenches with high aspect ratios.

DETAILED DESCRIPTION

Figure 1:
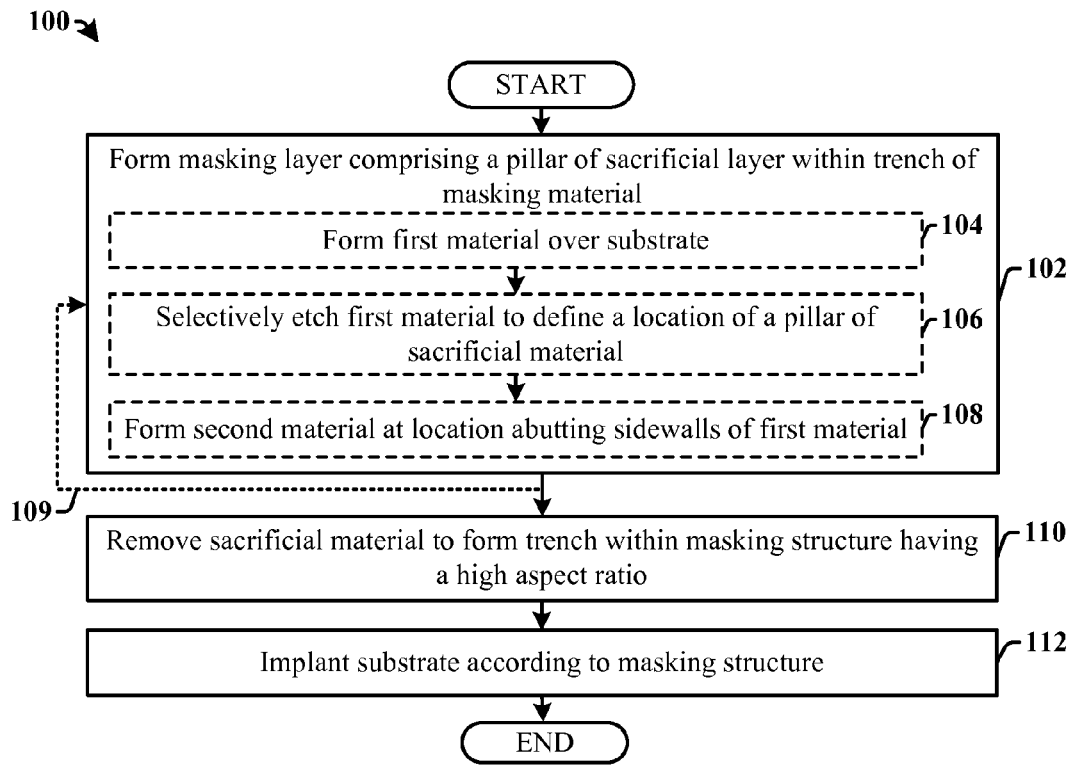
FIG. 1 illustrates a flow diagram of some embodiments of a method of forming a masking structure having a trench with a high aspect ratio.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, computers, etc.) include an image sensor for capturing images. One example of such an image sensor is a complementary metal-oxide semiconductor (CMOS) image sensor (CIS) including an array of active pixel sensors (APSs). An APS records the intensity of incident light using a photodetector (e.g., a photodiode) and facilitates digital readout of the recording with a plurality of transistors.

Increasingly, CISs are being scaled down to reduce pixel pitch (i.e., the size of an pixel sensor region and the distance between pixel sensor regions) to sub-micrometer levels. As the size of CISs decrease, isolation between pixel sensor regions is of great importance for proper operation. Back side illuminated (BIS) image sensors, which receive light on a back-side of a workpiece, typically employ shallow trench isolation (STI) regions to provide for isolation between adjacent pixel sensor regions. However, STI regions allow leakage current and/or cross talk between neighboring pixel sensor regions. To improve isolation between adjacent pixel sensor regions, deep isolation wells may be used in conjunction with the STI regions. The deep isolation wells use junction isolation to increase the electrical isolation between pixel sensor regions.

During formation of a CIS, a masking structure disposed upon a substrate may be used to define a position of deep isolation wells within the substrate. The masking structure has a masking material with a trench disposed therein. When an implantation is performed, the masking material will block an implant species while the trench allows the implant species to reach an underlying substrate. In emerging technology nodes (e.g., 32 nm node, 22 nm node, 14 nm node, etc.) the reduction in size of the pixel sensor regions will drive the size of the deep isolation wells to be smaller. However, due to the high energy of the implantation, the thickness of the masking material is not able to be reduced while still effectively masking the substrate. Therefore, it has been appreciated that for next generation CIS, a masking structure having a trench with a higher aspect ratio than that achievable by current etching processes (e.g., approximately 10) will be needed to continue to scale the size of the deep isolation wells.

Accordingly, the present disclosure relates to a method of forming a masking structure having a trench with a high aspect ratio (e.g., greater than or equal to approximately 20:1), and an associated structure. In some embodiments, the method comprises forming a first material over a substrate. The first material is selectively etched and a second material is formed onto the substrate at a position abutting sidewalls of the first material, resulting in a pillar of sacrificial material surrounded by a masking material. The pillar of sacrificial material is removed, resulting in a masking layer having a trench that extends into the masking material. Using the pillar of sacrificial material during formation of the trench allows the trench to have a high aspect ratio. For example, in some embodiments, the sacrificial material allows for a plurality of stacked masking layers to be iteratively formed to have laterally aligned openings that collectively for a trench that vertically extends through the plurality of stacked masking layers. By iteratively forming a plurality of stacked masking layers with aligned openings, limitations on the aspect ratio of the openings caused by etching processes can be overcome so as to increase an aspect ratio of a trench.

FIG. 1 illustrates a flow diagram of some embodiments of a method 100 of forming a masking structure having a trench with a high depth-to-width aspect ratio (e.g., greater than or equal to approximately 20:1). The high aspect ratio of the trench allows for the masking structure to be sufficiently thick to block a high-energy implantation in regions outside of the trench, while allowing the trench to define a relatively small implantation area within an underlying substrate.

At 102, a masking layer is formed on a substrate. The masking layer comprises a pillar of sacrificial material arranged within an opening in a masking material. In some embodiments, the pillar of sacrificial material may be formed prior to depositing the masking material. In other embodiments, the masking material may be deposited prior to forming the pillar of sacrificial material.

In some embodiments, the masking layer may be formed according to acts 104-108. At 104, a first material is formed over a substrate. At 106, the first material is selectively etched to define a location of the pillar of sacrificial material. At 108, a second material is deposited abutting sidewalls of the first material so as to form the pillar of sacrificial material within an opening in a masking material. In some embodiments, the first material may comprise a masking material (e.g., a dielectric), while the second material may comprise a sacrificial material. In other embodiments, the first material may comprise a sacrificial material, while the second material may comprise a masking material (e.g., a dielectric).

At 109, one or more of acts 104-108 may be iteratively performed to form one or more additional masking layers, in some embodiments. Iteratively performing acts 104-108 forms a multi-layer masking structure having a plurality of stacked masking layers with openings that are laterally aligned with one another. Since an opening in an underlying masking material is filled with sacrificial material, an overlying masking layer is able to be formed without filling in the opening of the underlying masking material. The laterally aligned openings collectively define a trench having a depth-to-width aspect ratio equal to the sum of the depth-to-width aspect ratios of openings in the plurality of the masking layers. Therefore, the aspect ratio of the trench can be selected based upon the number of iterations performed. For example, a trench formed according to a single iteration of acts 104-108 may have an aspect ratio that is ½ that of a trench formed according to two iterations of acts 104-108.

At 110, the pillar of sacrificial material is removed to form a trench within the masking structure having a high-aspect ratio. The pillar of sacrificial material is removed using an etchant having a high selectivity with respect to the masking material, so as to remove the pillar of sacrificial material without removing significant amounts of the masking material. In some embodiments, the trench may have a depth-to-width aspect ratio of greater than or equal to approximately 20:1.

At 112, the substrate is implanted according to the masking structure. The masking material of the masking structure has sufficient thickness to block the implantation, while the trench allows for the implantation to reach the substrate. The resulting implantation has a relatively small size corresponding to a width of the trench.

FIGS. 2A-2E illustrate some embodiments of cross-sectional views, 200a-200e, corresponding to a method of forming a masking structure having a trench with a high aspect ratio. Although FIGS. 2A-2E are described in relation to method 100, it will be appreciated that the structures disclosed in FIGS. 2A-2E are not limited to such a method, but instead may stand alone as structures independent of the method.

Figure 2A:
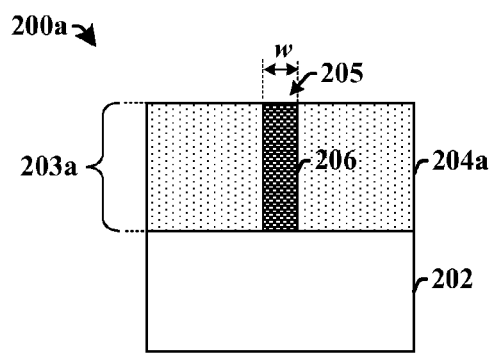
FIGS. 2A-2E illustrate some embodiments of cross-sectional views corresponding to a method of forming a masking structure having a trench with a high aspect ratio.

FIG. 2A illustrates some embodiments of a cross-sectional view 200a corresponding to a first iteration of act 102. As shown in cross-sectional view 200a, a first masking layer 203a is formed over a substrate 202. The first masking layer 203a comprises a pillar of sacrificial material 206 within a first opening 205 in a first layer of masking material 204. In some embodiments, the substrate 202 may comprise a bulk substrate of silicon, germanium, or group III and group V elements, and one or more overlying layers. Alternatively, the substrate 202 may comprise a semiconductor-on-insulator (SOI) substrate. In some embodiments, the first layer of masking material 204 may comprise a dielectric material, such as silicon dioxide ($SiO_2$), for example.

Figure 2B:
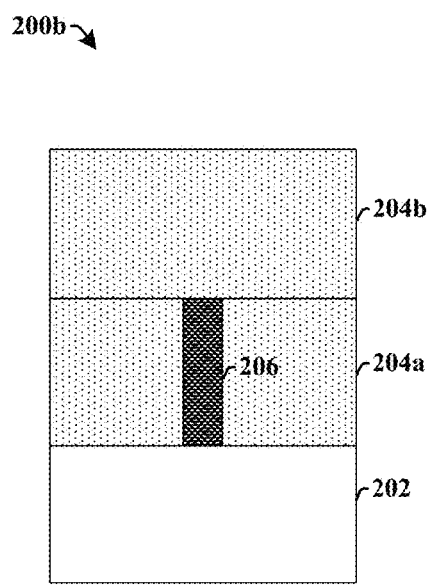
Figure 2C:
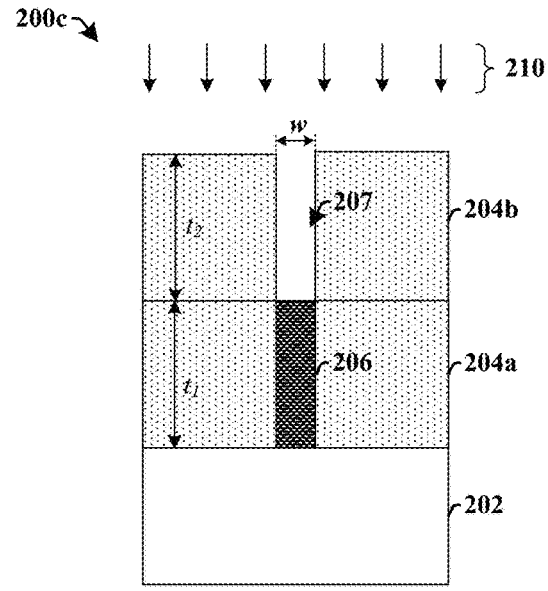

FIGS. 2B-2C illustrate some embodiments of cross-sectional views, 200b and 200c, which correspond to a second iteration of act 102.

As shown in cross-sectional view 200b, a second layer of masking material 208 is formed over the first layer of masking material 204. The second layer of masking material 208 abuts a top surface of the first layer of masking material 204 and the pillar of sacrificial material 206. In various embodiments, the first and second layers of masking material, 204 and 208, may comprise a same material (e.g., $SiO_2$) or one or more different materials. In some embodiments, the first and second layers of masking material, 204 and 208, may comprise a plurality of dielectric layers. In various embodiments, the first and second layers of masking material, 204 and 208, may respectively have thicknesses, $t_1$ and $t_2$, which are substantially the same or that are different. In some embodiments, $t_1$ and $t_2$, are in a range of between approximately 10 kA (kilo-angstroms) and approximately 15 kA.

As shown in cross-sectional view 200c, the second layer of masking material 208 is etched to form a second opening 207 overlying the pillar of sacrificial material 206. In some embodiments, a width w of the first and second openings, 205 and 207, may be in a range of between approximately 100 A (angstroms) and approximately 150 A.

Figure 2D:
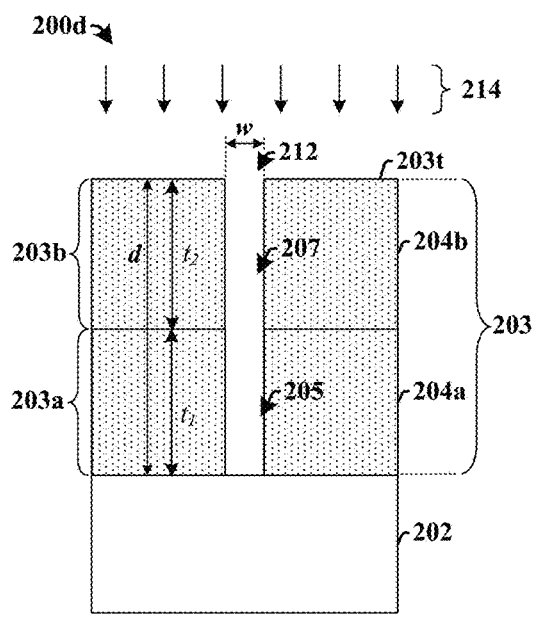

FIG. 2D illustrates some embodiments of a cross-sectional view 200d corresponding to act 110. As shown in cross-sectional view 200d, the pillar of sacrificial material (e.g., 206 of FIG. 2C) is removed from within the first layer of masking material 204. The resulting masking structure 203 comprises a plurality of stacked masking layers, 203a and 203b, having laterally aligned openings (along trench 212), 205 and 207, that extend through the layers. The openings, 205 and 207, collectively form trench 212. The trench 212 may vertically extend from a top surface 203t of the masking structure 203 to a depth d within the masking structure 203 or the substrate 202. In some embodiments, the trench 212 comprises a depth d that is equal to a sum of the heights, $t_1$ and $t_2$, of the first and second masking layers, 203a and 203b, and a width w that is equal to a width of the first and second openings, 205 and 207.

In some embodiments, the trench 212 has a width w, so that an aspect ratio of the depth d to the width w is greater than or equal to approximately 20 (i.e., the depth d is greater than or equal to approximately 20 times the width w). It will be appreciated that the aspect ratio of the trench 212 is equal to a sum of the aspect ratios of the first masking layer 203a and the second masking layer 203b. In some embodiments, the aspect ratio of the openings, 205 and 207, within the first and second masking layers, 203a and 203b, is less than or equal to 11.

Figure 2E:
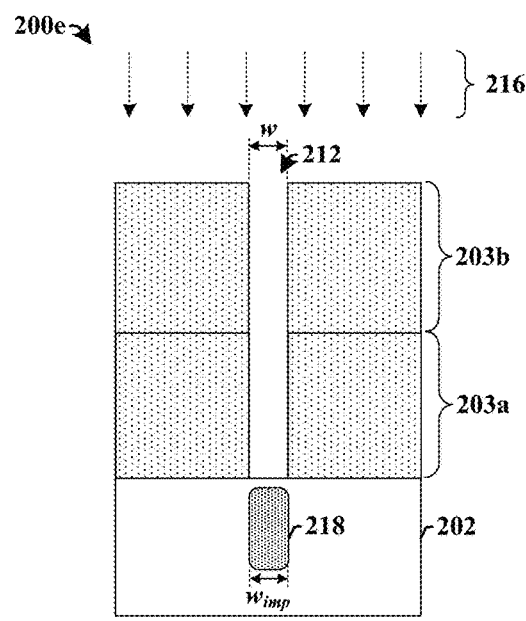

FIG. 2E illustrates some embodiments of a cross-sectional view 200e corresponding to act 112. As shown in cross-sectional view 200e, an implantation 216 is performed. The implantation 216 selectively implants the substrate 202 with a dopant species according to the masking structure 203. Therefore, the resulting implantation region 218 has a width, $w_{imp}$, that is defined by to the width w of the trench 212 The high aspect ratio of the trench 212 allows for the implantation region 218 to have a small width (e.g., in a range of between approximately 100 nm and approximately 150 nm). After the implantation is performed, the masking material is removed from the substrate 202.

In some embodiments, the method of forming a masking structure may be applied to the formation of deep isolation wells within a pixel sensor region of a CMOS image sensor (CIS). For example, FIG. 3 illustrates a flow diagram of some embodiments of a method of forming a CMOS image sensor (CIS) using a masking layer comprising a trench with a high aspect ratio.

While disclosed methods (e.g., methods 100, 300, 600, and 900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a first material is formed over a pixel sensor region located within a substrate.

At 304, the first material is selectively etched to define a location of a pillar of sacrificial material.

At 306, a second material is deposited at a location abutting sidewalls of the first material, so as to form a first masking layer having a pillar of sacrificial material laterally surrounded by a masking material.

At 307, one or more of acts 302-306 may be iteratively performed to form one or more additional masking layers over the first masking layer.

At 308, the pillar of sacrificial material is removed to form a masking structure having a trench with a high aspect ratio.

At 310, the substrate is implanted according to the masking structure. The masking material of the masking structure has sufficient thickness to block the implantation, while the trench allows for the implantation to reach the substrate.

At 312, the masking structure is removed.

At 314, additional implantations are performed within the pixel sensor region. In some embodiments, the additional implantations may form a photodetector region within the pixel sensor region.

At 316, contacts are formed in an inter-level dielectric (ILD) layer overlying the substrate.

FIGS. 4A-4F illustrate some embodiments of cross-sectional views showing a method of forming a CMOS image sensor (CIS) using a masking layer comprising a trench with a high aspect ratio. It will be appreciated that the method of forming a CIS described herein is not limited to the type of CIS described herein, but that the method may be used with alternative types of CIS (e.g., having different implantation regions).

FIG. 4A illustrates some embodiments of a cross-sectional view 400a corresponding to act 302. Cross-sectional view 400a illustrates a substrate 402 comprising a pixel sensor region 405. In some embodiments, the substrate 402 may comprise a silicon substrate 401 and an overlying epitaxial layer 403 having a first doping type (e.g., p-type). The pixel sensor region 405 is isolated from adjacent pixel sensor regions by isolation structures 404 (e.g., shallow trench isolation (STI) structures). A gate dielectric layer 406 is disposed over the substrate 402. A transfer gate electrode 408a and a reset gate electrode 408b are arranged onto the gate dielectric layer 406. In some embodiments, a resist protective oxide (RPO) layer 410 is disposed onto the gate dielectric layer 406 and the transfer gate electrode 408a, and the reset gate electrode 408b, and an etch stop layer (ESL) 412 is arranged onto the RPO layer 410. A first dielectric layer 414 is formed over the ESL 412.

FIG. 4B illustrates some embodiments of a cross-sectional view 400b corresponding to act 304. As shown in cross-sectional view 400b, the first dielectric layer 414 is selectively etched to form openings 416 that extend from a top of the first dielectric layer 414 to the ESL 412. Although the openings 416 are illustrated as being located over certain regions of the pixel sensor region, it will be appreciated that the openings 416 may be located at alternative and or additional positions. For example, although first and second gate electrodes, 408a and 408b, are illustrated as being patterned prior to the formation of the first dielectric layer 414, alternatively the transfer gate electrode 408a and a reset gate electrode 408b may be patterned after removal of the masking structure. In such embodiments, the openings 416 may overlie an un-patterned layer gate electrode material.

Figure 4C:
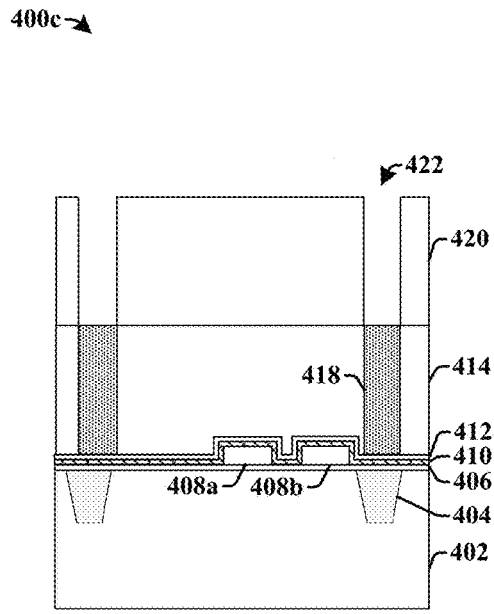

FIG. 4C illustrates some embodiments of a cross-sectional view 400c corresponding to act 306 and a second iteration of acts 302-304. As shown in cross-sectional view 400c, a sacrificial material is formed within openings 416 to form pillars of sacrificial material 418 surrounded by the first dielectric layer 414. A second dielectric layer 420 is formed over the first dielectric layer 414. The second dielectric layer 420 abuts a top surface of the first dielectric layer 414 and the pillars of sacrificial material 418. The second dielectric layer 420 has second openings 422 overlying the pillars of sacrificial material 418 4.

Figure 4D:
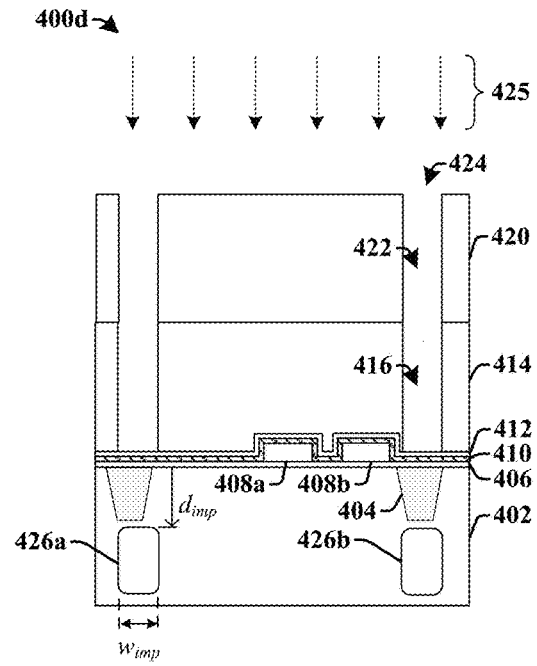

FIG. 4D illustrates some embodiments of a cross-sectional view 400d corresponding to acts 308-310. As shown in cross-sectional view 400d, the pillars of sacrificial material 418 are removed to form trenches 424 that vertically extend from the ESL 412 to a top of a masking structure comprising the first dielectric layer 414 and the second dielectric layer 420. An implantation 425 is subsequently performed into the substrate 402 according to the masking structure. The implantation 425 forms deep isolation wells, 426a and 426b, within the substrate 402 at positions corresponding to the trenches 426.

In some embodiments, the implantation may comprise an implantation species such as boron or phosphorus. In some embodiments, the implantation may have an energy of between approximately 1200 KeV and approximately 1800 KeV. The implantation energy forms the deep isolation wells, 426a and 426b, at a depth $d_{imp}$ of between approximately 1 um to approximately 2 um. The high aspect ratio of the trenches 424 also allows for the deep isolation wells, 426a and 426b, to have a relatively small widths $w_{imp}$ (e.g., between approximately 50 nm and approximately 200 nm).

Figure 4E:
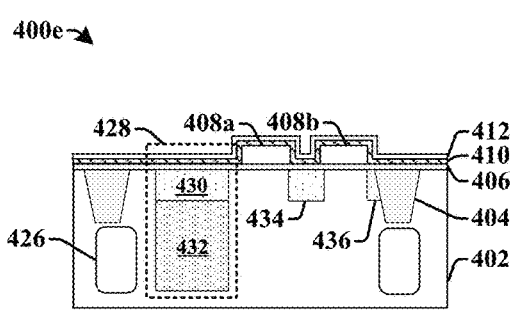

FIG. 4E illustrates some embodiments of a cross-sectional view 400e corresponding to acts 312-314. As shown in cross-sectional view 400e, the masking structure is removed and one or more additional implantations are performed. The one or more additional implantations form a photodiode 428 disposed within the substrate 402. In some embodiments, the photodiode 428 comprises a first region 430 having the first doping type (e.g., p-type) and a second underlying region 432 having a second doping type (e.g., n-type) opposite the first doping type. The one or more additional implantations may further form a floating diffusion region 434 disposed between the transfer gate electrode 408a and the reset gate electrode 408b, and an additional diffusion region 436 abutting isolation structure 404.

Figure 4F:
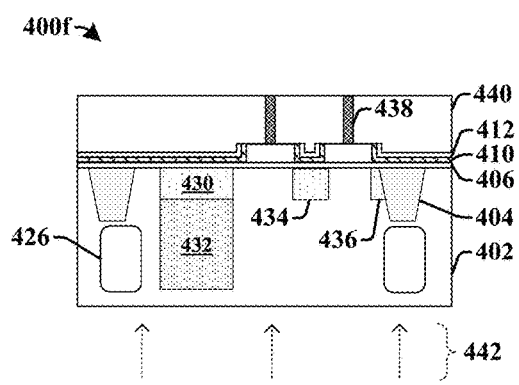

FIG. 4F illustrates some embodiments of a cross-sectional view 400f corresponding to act 304. As shown in cross-sectional view 400f, contacts 438 are formed over the transfer transistor gate electrode 408a, the reset transistor gate electrode 408b, and diffusion regions, 434 and 436. The contacts 438 comprise a conductive material (e.g., copper, tungsten, etc.) dispose within an inter-level dielectric (ILD) layer 440. In some embodiments, the CIS shown in cross-sectional view 400e may comprise a BSI (back side illuminated) CIS, which is configured to receive illumination 442 from a back side of the substrate 402 opposing the ILD layer 440. In such embodiments, one or more additional layers/elements (e.g., a micro-lens, a color filter, etc.) may be disposed onto the back side of the substrate 402.

Figure 5C:
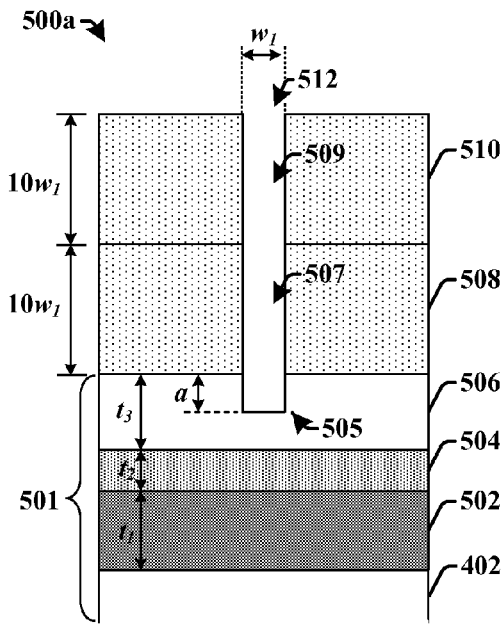
Figure 5C:
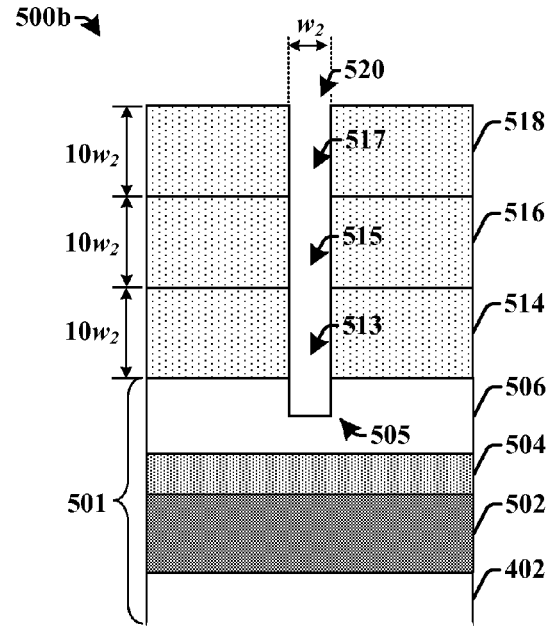
Figure 5C:
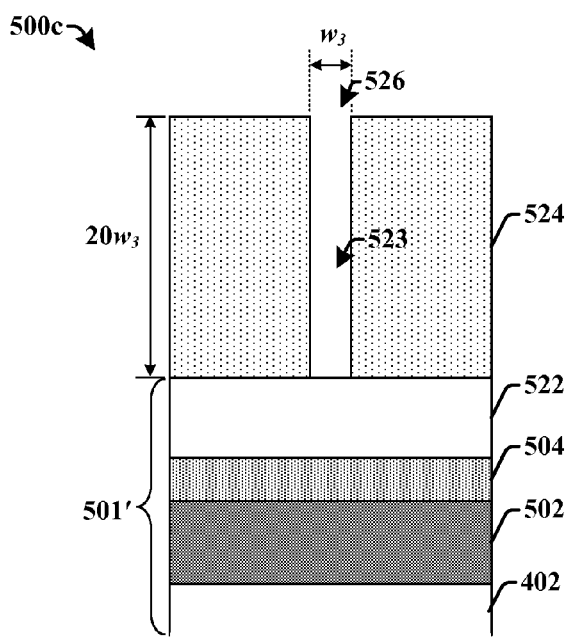

FIGS. 5A-5C illustrates cross-sectional views of some embodiments of masking structure having trenches with high aspect ratios. The masking structure of FIGS. 5A-5C use different number of dielectric layers and different dielectric layer thicknesses to achieve trenches having a high aspect ratio. Although FIGS. 5A-5C illustrates masking structures as having a selected number of dielectric layers with selected thicknesses, it will be appreciated that the disclosed masking structures may comprise dielectric layers having different thicknesses and/or a different number of dielectric layers. For example, a multi-layer masking structure may have more than 3 dielectric layers, which respectively have thicknesses that are greater than or less than those specified below.

FIG. 5A illustrates some embodiments of a cross-sectional view 500a of a multi-layer masking structure having a trench 512 with an aspect ratio (e.g., a ratio of the depth to width) of approximately 30:1.

As shown in cross-sectional view 500a, the multi-layer masking structure is arranged over a substrate 501. In some embodiments, the substrate 501 comprises a resist protective oxide (RPO) layer 504 disposed over a gate electrode layer 502, and an etch stop layer (ESL) 506 (e.g., a silicon nitride layer) disposed over the RPO layer 504. In some embodiments, the gate electrode layer 502 may comprise a polysilicon layer having a thickness $t_1$ of approximately 1000 A, the RPO layer 504 may have a thickness $t_2$ of approximately 550 A, and the ESL 506 may comprise a silicon nitride (SiN) layer having a thickness $t_3$ of approximately 1600 A. In some embodiments, a recess 505 is arranged in a top surface of the ESL 506. The recess 505 may extend into a top surface of the ESL 506 to a depth a. In some embodiments, the depth a may have a value in a range of between approximately 50 nm and approximately 100 nm.

A first dielectric layer 508 (e.g., $SiO_2$) is disposed over the ESL 506. The first dielectric layer 508 comprises a first opening 507 that is laterally aligned with (i.e., that overlies) the recess 505. In some embodiments, the first opening 507 may have a width $w_1$ and the first dielectric layer 508 may have a thickness that is equal to approximately $10*w_1$. A second dielectric layer 510 (e.g., $SiO_2$) is disposed over the first dielectric layer 508. The second dielectric layer 510 comprises a second opening 509 that is laterally aligned with (i.e., that overlies) the first opening 507. In some embodiments, the second opening 509 may have a width $w_1$ and the first dielectric layer 508 may have a thickness that is equal to approximately $10*w_1$. In some embodiments, the width $w_1$ may be equal to approximately 150 nm (so that the first and second dielectric layers have thicknesses of approximately 15 kA).

The recess 505, the first opening 507, and the second opening 509 collectively form a trench 512 having a depth in a range of between approximately 3,000 nm and approximately 3, 100 nm, and having a width $w_1$ of approximately 150 nm. The resulting aspect ratio (i.e., the ratio of the depth to width) of the trench 512 is approximately 20:1.

It will be appreciated that due to misalignment errors in the etching process, the trench 512 may have non-linear sidewalls. For example, the opening 509 in the second dielectric layer 510 may have a sidewall, which is laterally offset by a distance δ (e.g., 1-2 nm) from a sidewall of the opening 509 in the first dielectric layer 508. The plane at which the lateral offsets occur between dielectric layers (e.g., at an interface between the first dielectric layer 508 and the second dielectric layer 510) may be vertically separated from one another by a substantially equal distance. Furthermore, a residue (not shown) of a sacrificial material may be disposed within the trench 512 along sidewalls or a bottom surface of the trench 512. The residue comprises a different material than the first and second dielectric layers, 508 and 510, and fills a small minority of the trench 512. In some embodiments, the residue of the sacrificial material may comprise an etch removable dielectric material that has a large etching selectivity relative to the first and second dielectric layers, 508 and/or 510. For example, the residue of the sacrificial material may comprise a carbon doped ARC (anti-reflective coating) that can be removed by an $O_2$ plasma etch.

FIG. 5B illustrates some embodiments of a cross-sectional view 500b of a multi-layer masking structure having a trench 520 with an aspect ratio of approximately 30:1.

As shown in cross-sectional view 500b, a first dielectric layer 514 (e.g., $SiO_2$) is disposed over the ESL 506. The first dielectric layer 514 comprises a first opening 513 that is laterally aligned with recess 505. A second dielectric layer 516 is disposed over the first dielectric layer 514 and a third dielectric layer 518 is disposed over the second dielectric layer 516. The second and third dielectric layers, 516 and 518, respectively comprise second and third openings, 515 and 516, which are laterally aligned with the first opening 513. In some embodiments, the openings 513, 515, and 517 may have a width $w_2$, and the dielectric layers 514, 516, and 518 may have a thickness that is equal to approximately $10*w_2$. In some embodiments, the width $w_2$ may be equal to approximately 100 nm (so that the first, second, and third dielectric layers have thicknesses of approximately 1,000 nm).

The recess 505, the first opening 513, the second opening 515, and the third opening 517, collectively form a trench 520 having a depth in a range that is between approximately 3,050 nm and approximately 3,100 nm, and having a width of approximately 100 nm. The resulting aspect ratio of the trench 520 is approximately 30:1.

FIG. 5C illustrates some embodiments of a cross-sectional view 500c of a single-layer masking structure having a trench 526 with an aspect ratio of approximately 20:1.

As shown in cross-sectional view 500c, the single-layer masking structure comprises a substrate 501' having an etch stop layer (ESL) 522 disposed over the RPO layer 504 and having a substantially planar top surface. A dielectric material 524 is disposed over the ESL 522. The dielectric material 524 comprises an opening 523, which vertically extends from a top surface of the dielectric material 524 to the ESL 522. In some embodiments, the opening 523 may have a width $w_3$ and the dielectric material 524 may have a thickness that is equal to approximately $20*w_3$. In some embodiments, the width $w_3$ may be equal to approximately 150 nm, forming a trench 521 having a depth of approximately 3,000 nm, and an aspect ratio of approximately 20:1.

Figure 6:
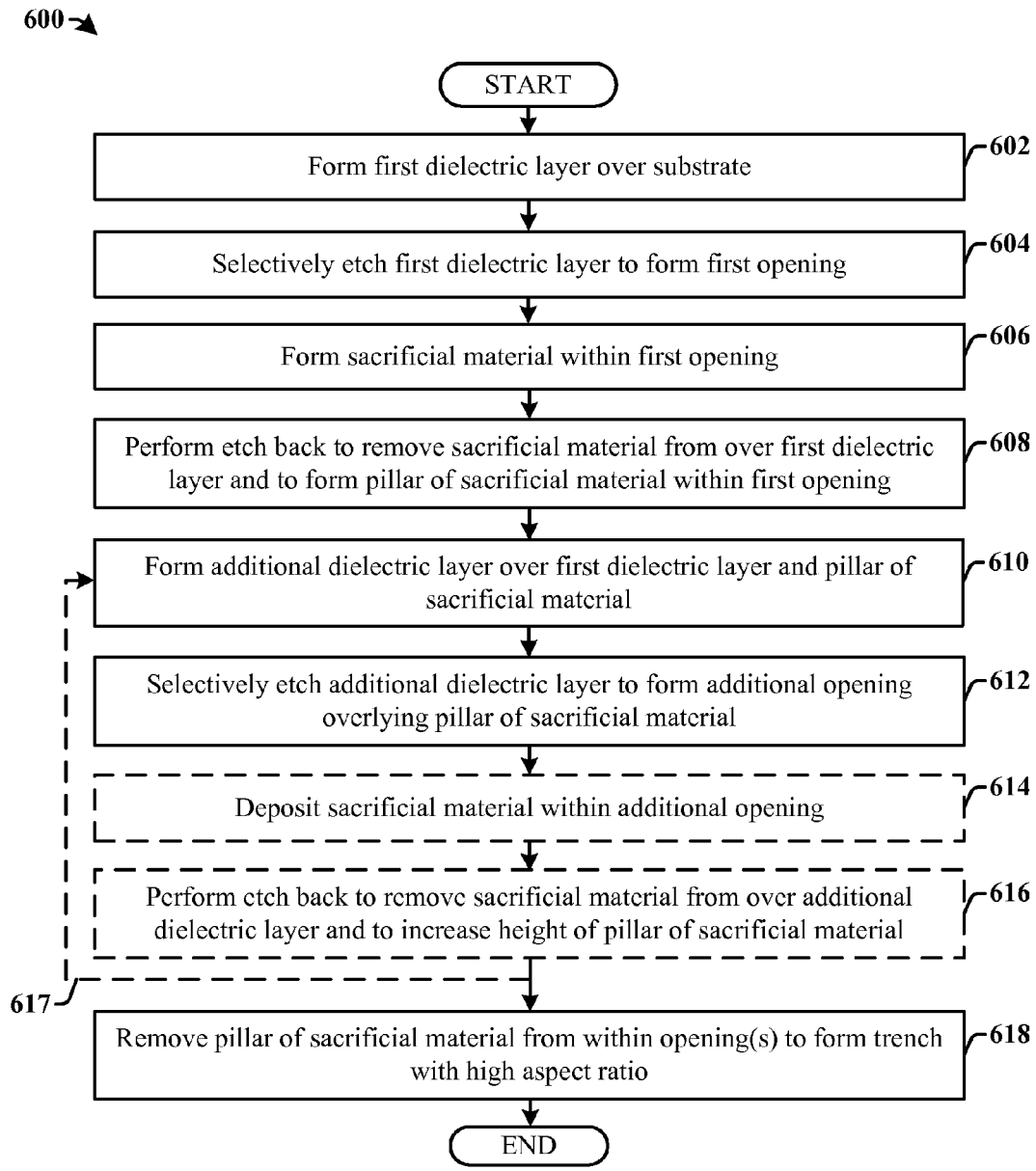
FIG. 6 illustrates a flow diagram of some additional embodiments of a method of forming a multi-layer masking structure having a trench with a high aspect ratio.

FIG. 6 illustrates a flow diagram of some additional embodiments of a method 600 of forming a multi-layer masking structure having a trench with a high aspect ratio.

At 602, a first dielectric layer is formed over a substrate.

At 604, the first dielectric layer is selectively etched to form a first opening.

At 606, a sacrificial material is formed within the first opening.

At 608, an etch back process is performed to remove the sacrificial material from over the first dielectric layer and to form a pillar of sacrificial material within the first opening.

At 610, an additional dielectric layer is formed over the first dielectric layer and the pillar of sacrificial material.

At 612, the additional dielectric layer is selectively etched to form an additional opening over the pillar of sacrificial material.

At 614, a sacrificial material may be deposited within the additional opening onto the pillar of sacrificial material, in some embodiments. For example, if the additional dielectric layer is the final (i.e., top) layer of the masking structure, act 612 can be skipped since no additional dielectric layers will be formed over the dielectric layer. Alternatively, if additional dielectric layers are to be formed over the dielectric layer, act 612 will be performed.

At 616, an etch back is performed to remove sacrificial material from over the additional dielectric layer and to increase a height of the pillar of sacrificial material, in some embodiments.

At 617, one or more of acts 610-616 may be iteratively repeated to form a multi-layer masking structure having a plurality of masking layers with openings that are vertically aligned with one another, in some embodiments.

At 618, the pillar of sacrificial material is removed from the opening(s) (e.g., the first opening and one or more additional openings) to form a masking structure having trench with a high aspect ratio.

FIGS. 7A-7F illustrate some embodiments of cross-sectional views showing a method of forming a multi-layer masking structure having a trench with a high aspect ratio. Although FIGS. 7A-7F are described in relation to method 600, it will be appreciated that the structures disclosed in FIGS. 7A-7F are not limited to such a method, but instead may stand alone as structures independent of the method.

Figure 7A:
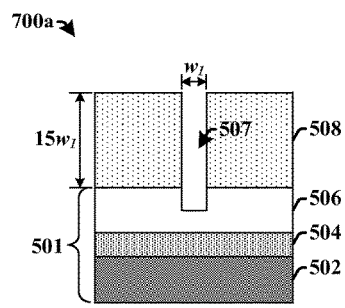
FIGS. 7A-7F illustrate some embodiments of cross-sectional views showing a method of forming a multi-layer masking structure having a trench with a high aspect ratio.

FIG. 7A illustrates some embodiments of a cross-sectional view 700a of an integrated chip corresponding to acts 602-604. As shown in cross-sectional view 700a, a first dielectric layer 508 is formed onto a substrate 501. In some embodiments, the first dielectric layer 508 may be deposited by way of a vapor deposition technique (e.g., physical vapor deposition, chemical vapor deposition, etc.). The first dielectric layer 508 is selectively etched to form a first opening 507 having a width $w_1$. In some embodiments, the first dielectric layer 508 may be selectively exposed to an etchant according to a first masking layer formed onto the first dielectric layer 508. In various embodiments, the etchant may comprise a dry etchant have an etching chemistry comprising a fluorine species (e.g., $CF_4$, $CHF_3$, $C_4F_8$, etc.) or a wet etchant comprising hydroflouric acid (HF), for example.

Figure 7B:
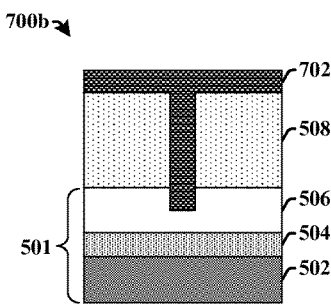

FIG. 7B illustrates some embodiments of a cross-sectional view 700b of an integrated chip corresponding to act 606. As shown in cross-sectional view 700b, a sacrificial material 702 is formed within the first opening 507. The sacrificial material 702 vertically extends from the substrate 501 to a top surface of the first dielectric layer 508. In some embodiments, the sacrificial material 702 may be deposited by way of a vapor deposition technique (e.g., physical vapor deposition, chemical vapor deposition, etc.). In some embodiments, the sacrificial material 702 may comprise an etch removable dielectric material that has a large etching selectivity relative to the first dielectric layer 508. For example, the sacrificial material may comprise a carbon doped ARC (anti-reflective coating) that can be removed by an $O_2$ plasma etch).

Figure 7C:
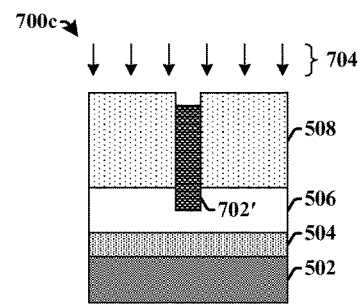

FIG. 7C illustrates some embodiments of a cross-sectional view 700c of an integrated chip corresponding to act 608. As shown in cross-sectional view 700c, an etch back process may be performed to remove the sacrificial material from over the first dielectric layer 508 and to form a pillar of sacrificial material 702' within the first dielectric layer 508. In some embodiments, the etch back process may comprise a dry etching process (e.g., using an etching chemistry comprising $O_2$).

Figure 7D:
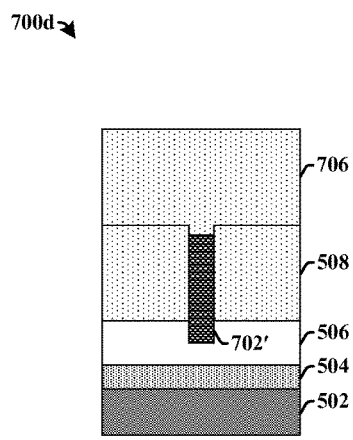

FIG. 7D illustrates some embodiments of a cross-sectional view 700d of an integrated chip corresponding to act 610. As shown in cross-sectional view 700d, a second dielectric layer 706 is formed over the first dielectric layer 508 and the pillar of sacrificial material 702'. In some embodiments, the second dielectric layer 706 may be deposited by way of a vapor deposition technique (e.g., physical vapor deposition, chemical vapor deposition, etc.).

Figure 7E:
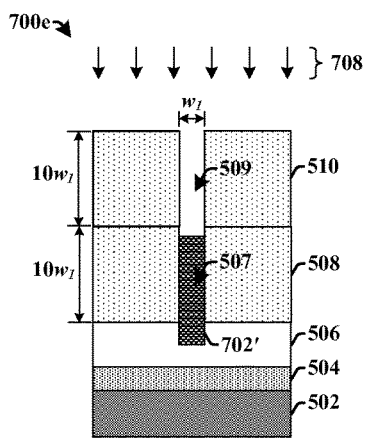

FIG. 7E illustrates some embodiments of a cross-sectional view 700e of an integrated chip corresponding to act 612. As shown in cross-sectional view 700e, the second dielectric layer 706 is selectively etched to form a second opening 509. In some embodiments, the second dielectric layer 706 may be exposed to an etchant according to a second masking layer formed onto the second dielectric layer 706.

Figure 7F:
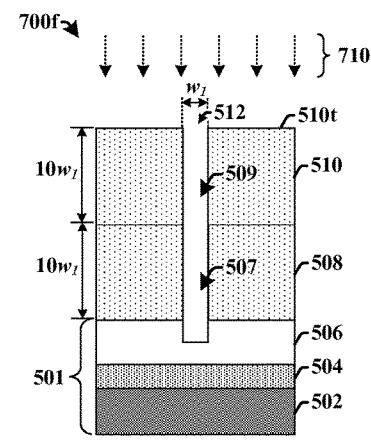

FIG. 7F illustrates some embodiments of a cross-sectional view 700f of an integrated chip corresponding to act 618. As shown in cross-sectional view 700f, the pillar of sacrificial material 702' is removed from the first opening 507. In some embodiments, the pillar of sacrificial material 702' may be removed from the first opening 507 by way of a plasma ashing process (e.g., having an $O_2$ etching chemistry). The resulting trench 512 vertically extends from the substrate 501 to a top surface 510t of the second dielectric layer 510 and has an aspect ratio that is equal to a sum of the aspect ratios of opening 507 and 509. For example, the aspect ratio may be greater than approximately 20:1.

FIGS. 8A-8F illustrate some alternative embodiments of cross-sectional views showing a method of forming a multi-layer masking structure having a trench with a high aspect ratio. Although FIGS. 8A-8F are described in relation to method 600, it will be appreciated that the structures disclosed in FIGS. 8A-8F are not limited to such a method, but instead may stand alone as structures independent of the method.

Figure 8A:
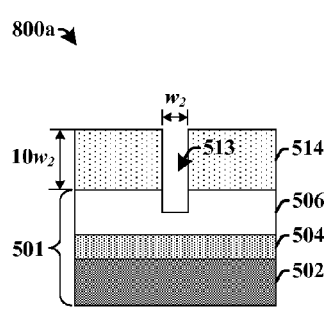
FIGS. 8A-8F illustrate some alternative embodiments of cross-sectional views showing a method of forming a multi-layer masking structure having a trench with a high aspect ratio.

FIG. 8A illustrates some embodiments of a cross-sectional view 800a of an integrated chip corresponding to act 602. As shown in cross-sectional view 800a, a first dielectric layer 514 is formed onto a substrate 501. In some embodiments, the first dielectric layer 514 may be deposited by way of a vapor deposition technique (e.g., physical vapor deposition, chemical vapor deposition, etc.). The first dielectric layer 514 is selectively etched to form a first opening 513 having a width $w_2$.

Figure 8B:
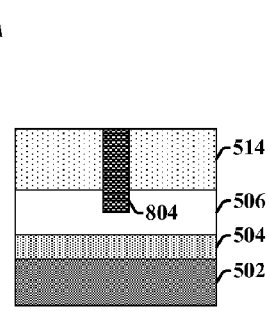

FIG. 8B illustrates some embodiments of a cross-sectional view 800b of an integrated chip corresponding to acts 606-608. As shown in cross-sectional view 800b, a pillar of sacrificial material 804 is formed within the first opening 513. The pillar of sacrificial material 804 vertically extends from the substrate 501 to a top surface of the first dielectric layer 514. In some embodiments, the pillar of sacrificial material 804 may be formed by depositing a sacrificial material within the first opening 513 followed by an etch back process to remove the sacrificial material from over the first dielectric layer 514.

Figure 8C:
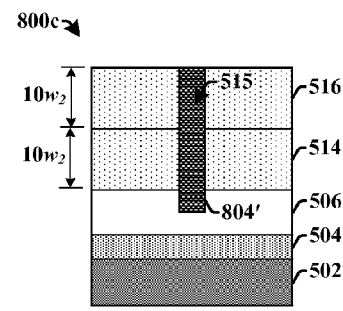

FIG. 8C illustrates some embodiments of a cross-sectional view 800c of an integrated chip corresponding to a first iteration of acts 610-616. As shown in cross-sectional view 800c, a second dielectric layer 516 is formed over the first dielectric layer 514 and the pillar of sacrificial material 804. In some embodiments, the second dielectric layer 516 may be deposited by way of a vapor deposition technique (e.g., physical vapor deposition, chemical vapor deposition, etc.). The second dielectric layer 516 is selectively etched to form a second opening 515. The second opening 515 overlies the pillar of sacrificial material 804. The second opening 515 is then filled with sacrificial material. An etch back process is then performed to remove sacrificial material from over the second dielectric layer 516 and to increase a height of the pillar of sacrificial material 804'.

Figure 8D:
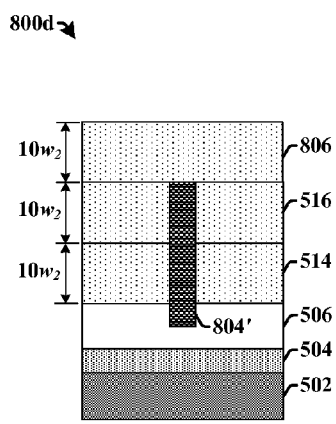

FIG. 8D illustrates some embodiments of a cross-sectional view 800d of an integrated chip corresponding to a second iteration of act 610. As shown in cross-sectional view 800d, a third dielectric layer 806 is formed over the second dielectric layer 516 and the pillar of sacrificial material 804'.

Figure 8E:
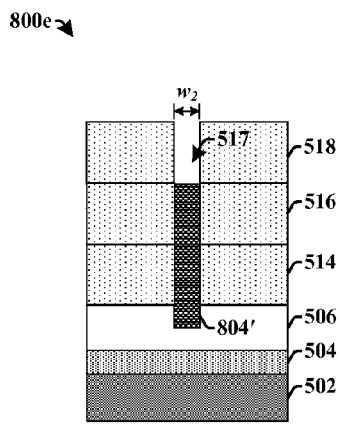

FIG. 8E illustrates some embodiments of a cross-sectional view 800e of an integrated chip corresponding to a second iteration of act 612. As shown in cross-sectional view 800e, the third dielectric layer 518 is selectively etched to form a third opening 517 overlying the pillar of sacrificial material 804'.

Figure 8F:
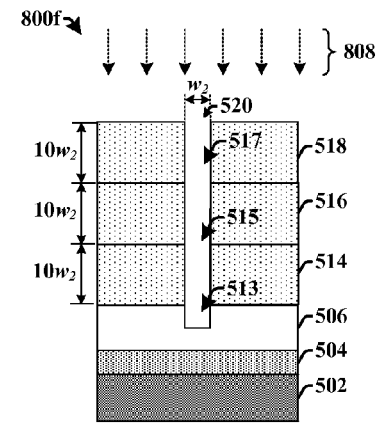

FIG. 8F illustrates some embodiments of a cross-sectional view 800f of an integrated chip corresponding to act 618. As shown in cross-sectional view 800f, the pillar of sacrificial material 804' is removed from the first and second openings, 513 and 515, to form a trench 520 vertically extending from the substrate 501 to a top surface of the third dielectric layer 518. In some embodiments, the pillar of sacrificial material 804' may be removed using a plasma ashing process 808. The resulting trench 520 has an aspect ratio that is equal to a sum of the aspect ratios of openings 513, 515, and 517. For example, the aspect ratio may be greater than approximately 20:1.

Figure 9:
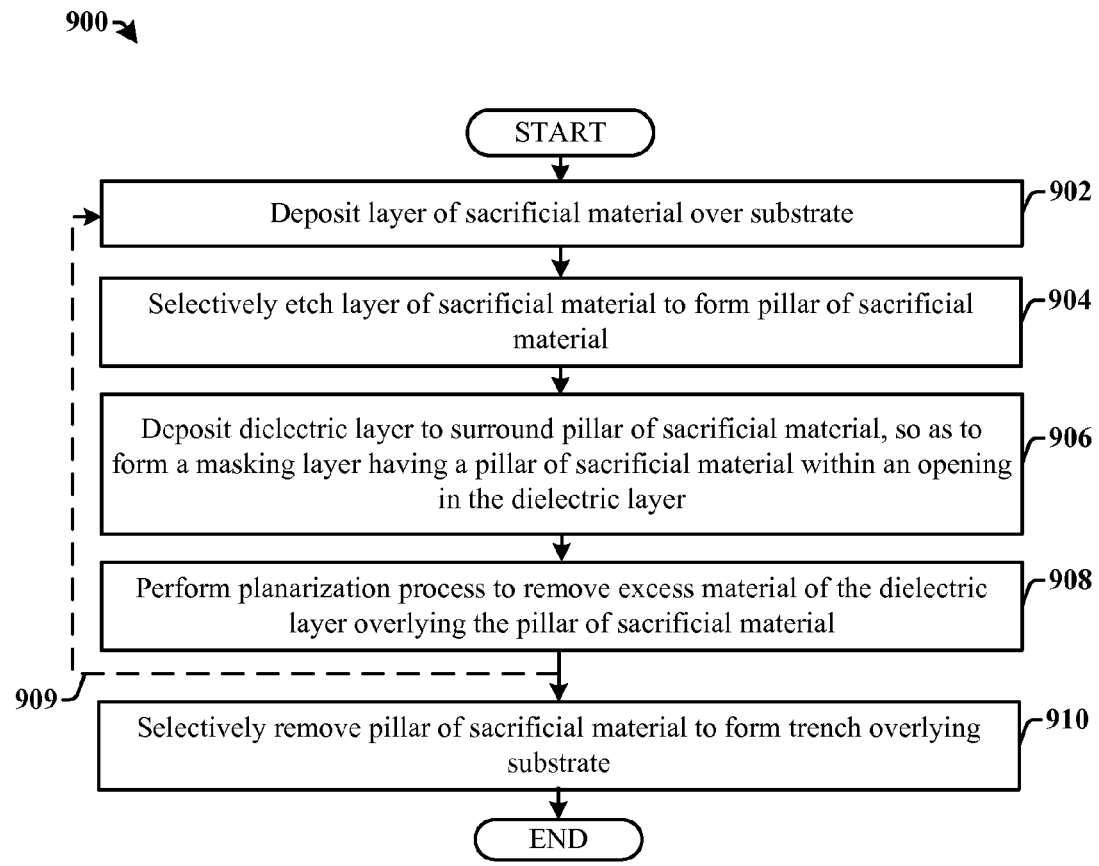
FIG. 9 illustrates a flow diagram of some alternative embodiments of a method of forming a masking structure having a trench with a high aspect ratio.

FIG. 9 illustrates a flow diagram of some alternative embodiments of a method 900 of forming a masking structure having a trench with a high aspect ratio.

At 902, a layer of sacrificial material is formed over a substrate.

At 904, the layer of sacrificial material is selectively etched to form a pillar of sacrificial material.

At 906, a dielectric layer is formed to laterally surround the pillar of sacrificial material, so as to form a masking layer having a pillar of sacrificial material within an opening in the dielectric layer. It will be appreciated that since the masking layer is formed by depositing a dielectric material around a pillar of sacrificial material, the aspect ratio limitations present when etching into the dielectric material are avoided. Therefore, a single iteration of acts 902-906 may be able to form an opening in the dielectric layer having an aspect ratio of greater than or equal to approximately 20:1.

At 908 a planarization process is performed to remove excess material of the dielectric layer overlying the pillar of sacrificial material.

At 909, acts 902-908 may be iteratively repeated to form a multi-layer masking structure having a plurality of masking layers with openings that are vertically aligned with one another, in some embodiments.

At 910, the pillar of sacrificial material is removed to form a trench having a high aspect ratio overlying the substrate.

FIGS. 10A-10E illustrate some embodiments of cross-sectional views showing a method of forming a masking structure having a trench with a high aspect ratio. Although FIGS. 10A-10E are described in relation to method 900, it will be appreciated that the structures disclosed in FIGS. 10A-10E are not limited to such a method, but instead may stand alone as structures independent of the method.

Figure 10A:
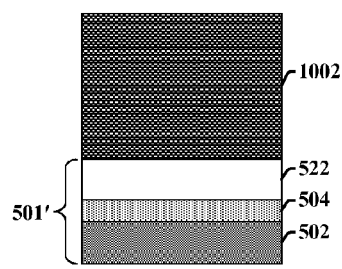
FIGS. 10A-10E illustrate some embodiments of cross-sectional views showing a method of forming a masking structure having a trench with a high aspect ratio.

FIG. 10A illustrates some embodiments of a cross-sectional view 1000a of an integrated chip corresponding to act 902. As shown in cross-sectional view 1000a, a sacrificial material 1002 is formed onto a substrate 501'. In some embodiments, the substrate 501' may comprise an etch stop layer (ESL) 522 having a substantially flat top surface overlying an RPO layer 504 and a gate electrode layer 502. In some embodiments, the sacrificial material 1002 may be deposited by way of a vapor deposition technique (e.g., physical vapor deposition, chemical vapor deposition, etc.).

Figure 10B:
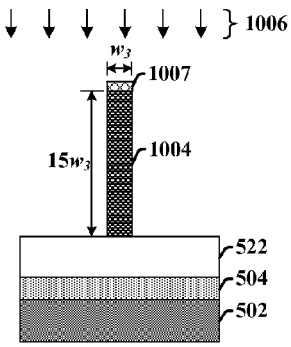
Figure 10C:
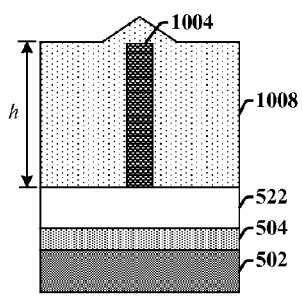

FIG. 10B illustrates some embodiments of a cross-sectional view 1000b of an integrated chip corresponding to act 904. As shown in cross-sectional view 1000b, the sacrificial material 1002 is selectively etched to form a pillar of sacrificial material 1004. In some embodiments, the sacrificial material 1002 may be exposed to an etchant 1006 according to a masking layer 1007 formed onto the sacrificial material 1002. In various embodiments, the etchant 1006 may comprise a dry etchant have an etching chemistry comprising $O_2$, for example FIG. 10C illustrates some embodiments of a cross-sectional view 1000c of an integrated chip corresponding to act 906. As shown in cross-sectional view 1000c, a dielectric material 1008 is formed to surround the pillar of sacrificial material 1004. The dielectric material 1008 vertically extends from the substrate 501' to over a top surface of the pillar of sacrificial material 1004. In some embodiments, the dielectric material 1008 may be deposited by way of a vapor deposition technique (e.g., physical vapor deposition, chemical vapor deposition, etc.). In some embodiments, the dielectric material 1006 may be deposited to a thickness in a range of between approximately 30 kÅ and approximately 35 kÅ. Since the dielectric material 1008 is formed over the pillar of sacrificial material 1004, it may form a bump in a top surface of the dielectric material 1008 overlying the pillar of sacrificial material 1004.

Figure 10D:
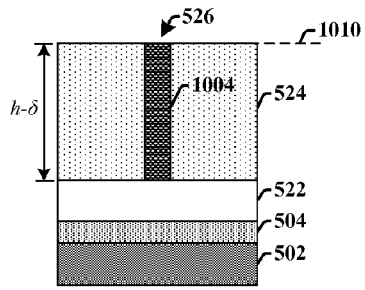

FIG. 10D illustrates some embodiments of a cross-sectional view 1000d of an integrated chip corresponding to act 908. As shown in cross-sectional view 1000d, a planarization process is performed (along line 1010) to remove a portion of the dielectric material 524 and/or a portion of the pillar of sacrificial material 1004. In some embodiments, the planarization process may comprise a chemical mechanical polishing (CMP) process or an etching process. The planarization process may reduce a thickness of the dielectric material 524 and/or the pillar of sacrificial material 1004. For example, the planarization process may reduce a thickness of the dielectric material 524 from approximately 33 kÅ to approximately 30 kÅ.

Figure 10E:
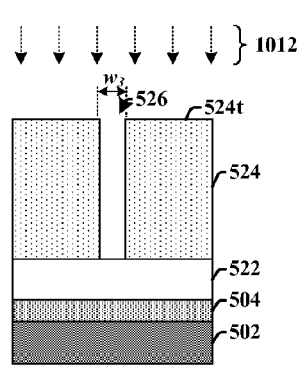

FIG. 10E illustrates some embodiments of a cross-sectional view 1000e of an integrated chip corresponding to act 918. As shown in cross-sectional view 1000e, the pillar of sacrificial material (e.g., 1004 of FIG. 10D) is removed to form a trench 526 that vertically extends from the substrate 501' to a top surface 524t of the dielectric material 524. The trench 526 may have an aspect ratio of greater than approximately 20. In some embodiments, the sacrificial material may be removed from the trench 526 by way of a plasma ashing process (e.g., using an etchant 1012 having an $O_2$ etching chemistry).

Therefore, the present disclosure relates to a method of forming a masking structure having a trench with a high aspect ratio (e.g., greater than or equal to approximately 20:1), and an associated structure.

In some embodiments, the present disclosure relates to a method of implanting a substrate. The method comprises forming a first material over a substrate, and selectively etching the first material to define a location of a pillar of sacrificial material. The method further comprises forming a second material at a location abutting sidewalls of the first material, resulting in the pillar of sacrificial material arranged within a first opening in a surrounding masking material. The method further comprises removing the sacrificial material to form a masking structure comprising a trench surrounded by the masking material. The method further comprises selectively implanting the substrate according to the masking structure.

In some embodiments, the present disclosure relates to a method of implanting a substrate. The method comprises forming a first dielectric layer over a substrate, and selectively etching the first dielectric layer to form a first opening. The method further comprises depositing a sacrificial material within the first opening to form a pillar of sacrificial material within the first dielectric layer. The method further comprises forming a second dielectric layer onto the first dielectric layer and the pillar of sacrificial material, and selectively etching the second dielectric layer to form a second opening overlying the pillar of sacrificial material, wherein the first opening and the second opening have substantially same widths. The method further comprises removing the pillar of sacrificial material to form a masking structure having a trench comprising the first opening and the second opening.

In yet other embodiments, the present disclosure relates to an integrated chip structure, comprising a masking material arranged over a substrate, and a trench disposed within the masking material and extending from a top surface of the masking material to a position within the masking material or the substrate. The trench has an aspect ratio of a depth to a width that is greater than or equal to approximately 20.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of implanting a substrate, comprising:
   forming a first material over a substrate, wherein the substrate comprises a gate electrode layer, a resist protection oxide layer disposed onto the gate electrode layer, and an etch stop layer disposed onto the resist protection oxide layer;
   selectively etching the first material to define a location of a pillar of sacrificial material;
   forming a second material at a location abutting sidewalls of the first material, resulting in the pillar of sacrificial material arranged within a first opening in a surrounding masking material;
   removing the pillar of sacrificial material to form a masking structure comprising a trench surrounded by the masking material, wherein the masking structure is disposed onto the etch stop layer;
   selectively implanting the substrate according to the masking structure; and
   removing the masking structure after selectively implanting the substrate.

2. The method of claim 1, further comprising:
   forming the first material by depositing a first dielectric layer over the substrate;
   selectively etching the first material by selectively etching the first dielectric layer to form a first opening within the first dielectric layer; and
   forming the second material by depositing a sacrificial material within the first opening to form the pillar of sacrificial material.

3. The method of claim 2, further comprising:
   forming a second dielectric layer over the first dielectric layer and the pillar of sacrificial material; and
   selectively etching the second dielectric layer to form a second opening overlying the pillar of sacrificial material.

4. The method of claim 3, wherein the first opening and the second opening respectively comprise depth-to-width aspect ratios that are less than or equal to approximately 10:1.

5. The method of claim 1, wherein the pillar of sacrificial material comprises a high etching selectivity relative to the masking material.

6. The method of claim 1, further comprising
   implanting the substrate according to the masking structure to form a plurality of deep isolation wells disposed within in a pixel sensor region comprising a photodiode disposed between shallow trench isolation regions.

7. The method of claim 1, wherein the substrate is implanted at an energy of greater than or equal to approximately 1,000 KeV.

8. A method of implanting a substrate, comprising:
forming a first dielectric layer over a substrate;
selectively etching the first dielectric layer to form a first opening;
depositing a sacrificial material within the first opening to form a pillar of sacrificial material within the first dielectric layer;
forming a second dielectric layer onto and in direct contact with top surfaces of the first dielectric layer and the pillar of sacrificial material;
selectively etching the second dielectric layer to form a second opening overlying the pillar of sacrificial material, wherein the first opening and the second opening have substantially same widths; and
removing the pillar of sacrificial material to form a masking structure having a trench comprising the first opening and the second opening.

9. The method of claim 8, wherein the sacrificial material fills the first opening.

10. The method of claim 8, wherein the pillar of sacrificial material comprises a high etching selectivity relative to the first dielectric layer and the second dielectric layer.

11. The method of claim 8, wherein the first opening and the second opening respectively comprise depth-to-width aspect ratios that are approximately 10:1; and
wherein the trench has a depth-to-width aspect ratio that approximately 20:1.

12. The method of claim 8, wherein the second opening has a sidewall that is laterally offset from a sidewall of the first opening.

13. The method of claim 8, wherein the substrate comprises:
a gate electrode layer;
a resist protection oxide (RPO) layer disposed onto the gate electrode layer; and
an etch stop layer disposed onto the resist protection oxide layer, wherein the masking structure is disposed onto the etch stop layer.

14. The method of claim 8, further comprising:
removing the masking structure after selectively implanting the substrate.

15. The method of claim 8, further comprising:
selectively implanting the substrate according to the masking structure to form a first deep isolation well within the substrate.

16. A method, comprising:
forming an etch stop layer over a substrate;
forming a first dielectric layer over the etch stop layer;
selectively etching the first dielectric layer to form a first opening extending through the first dielectric layer;
depositing a sacrificial dielectric material within the first opening;
forming a second dielectric layer onto the first dielectric layer and the sacrificial dielectric material;
selectively etching the second dielectric layer to form a second opening extending through the second dielectric layer to the sacrificial dielectric material;
removing the sacrificial dielectric material to form a masking structure having a trench comprising the first opening and the second opening;
selectively implanting the substrate according to the masking structure to form a first deep isolation well within the substrate; and
removing the masking structure after selectively implanting the substrate.

17. The method of claim 16, further comprising:
performing one or more additional implantations within the substrate, to form a photodiode disposed within the substrate at a location between the first deep isolation well and a second deep isolation well with the substrate.

18. The method of claim 16, further comprising:
forming a layer of gate electrode material over the substrate prior to forming the first dielectric layer;
selectively implanting the substrate according to the masking structure to form a first deep isolation well within the substrate;
removing the masking structure after selectively implanting the substrate; and
patterning the layer of gate electrode material after removal of the masking structure.

19. The method of claim 16, wherein the first dielectric layer and the second dielectric layer comprise a same material that is different than the sacrificial dielectric material.

* * * * *